(12) United States Patent
Baudon et al.

(10) Patent No.: US 6,891,623 B1
(45) Date of Patent: May 10, 2005

(54) METHOD AND DEVICE FOR ATOMIC INTERFEROMETRY NANOLITHOGRAPHY

(75) Inventors: Jacques Baudon, Paris (FR); Jacques Robert, Paris (FR)

(73) Assignee: Universite Paris 13, Villetaneuse (FR)

( * ) Notice: Subject to any disclaimer, the term of this patent is extended or adjusted under 35 U.S.C. 154(b) by 247 days.

(21) Appl. No.: 10/089,176
(22) PCT Filed: Sep. 27, 2000
(86) PCT No.: PCT/FR00/02664
§ 371 (c)(1), (2), (4) Date: Aug. 20, 2002
(87) PCT Pub. No.: WO01/24219
PCT Pub. Date: Apr. 5, 2001

(30) Foreign Application Priority Data

Sep. 27, 1999 (FR) .......................................... 99 12016

(51) Int. Cl.[7] ................................................. G01B 9/02
(52) U.S. Cl. ....................................... 356/491; 356/450
(58) Field of Search ................................. 356/450, 491

Primary Examiner—Andrew H. Lee
(74) Attorney, Agent, or Firm—Morgan Lewis & Bockius LLP (57) ABSTRACT

The invention proposes a novel technique for implementing high performance atomic lithography, and in particular high resolution lithography. The technique makes use of Stern-Gerlach type atomic interferometry enabling disturbances to be implemented in the atomic phase of the beam. Such interaction then directly modulates the intensity of the associated wave in the plane extending transversely to the beam of atoms, and does so in controllable manner. The installation of the invention for nanolithography by atomic interferometry comprises a Stern-Gerlach type interferometer comprising, as its phase object, four-pole magnetic induction having a transverse gradient created by four parallel bars carrying alternating direct currents, bracketed between two separator plates, preceded and followed respectively by a spin polarizer and by an analyzer operating by laser pumping. An additional uniform field is being created by another four additional bars powered in paired manner by adjustable currents in order to create a uniform field of arbitrary intensity and orientation for the interference pattern by adjusting the two current parameters. The source of atoms is a source that continuously discharges metastable helium or argon with approximately Maxwell type speed dispersion of about 30% to 40% in order to obtain a central spot.

13 Claims, 5 Drawing Sheets

METHOD AND DEVICE FOR ATOMIC INTERFEROMETRY NANOLITHOGRAPHY

The invention relates to a method of performing lithography at nanometer scale by using atomic interferometry, and it also relates to an installation for implementing such a method.

BACKGROUND OF THE INVENTION

The invention relates to the field of lithography at submicron scale. By projecting beams of atoms either of alkali type (e.g. Na, Li, or Cr) or of metastable type (He* or Ar*), atomic lithography makes it possible, via a mask, respectively to cause substance to be deposited on a substrate to be treated or to cause a pattern to be etched in a resin deposited on that substrate. The article by M. Kreis et al., published in Applied Physics, Vol. B63, 649 (1996), illustrates that type of technique.

Compared with the more conventional technique of photon lithography, atomic lithography presents advantages which relate to the implementation conditions and to the physical limits of these techniques:

- the photon source, generally a UV laser, requires high brightness and means that are complex and expensive for producing photons at shorter and shorter wavelengths in order to increase the resolution of the installation (e.g. an Nd:YAG type laser for exciting a supersonic jet of xenon atoms);
- a magnifying optical system (magnifying by a factor of 4 or 5) formed by multilayer mirrors of reflectivity that is selective in wavelength and of limited lifetime; and
- pattern thickness is limited by the wavelength used, e.g. 157 nanometers (nm) for the above-mentioned xenon jet in devices for producing extreme UV radiation close to soft X-rays.

Micro-lithographic techniques based on atomic optics use thermal or quasi-supersonic beams of atoms that are confined in a magneto-optical trap. In such techniques, the beam of atoms is collimated by laser cooling and it interacts with an optical mask. A mask of this type is generally formed by a standing lightwave that is blue-shifted relative to the atomic transition frequency, thus creating a periodic repulsive potential on the path of the atoms. Such a potential acts as a grating having a pitch equal to half the optical wavelength. Such applications are described, for example, in the article by E. M. Rasel published in Physical Review Letter, Vol. 75, 2633 (1995).

It is thus possible to deposit or etch a series of parallel lines on the substrate, or by using two crossed masks it is possible to obtain a periodic array of predetermined geometrical shape (square, rectangular, or lozenge-shaped).

The atomic technique is, by its very essence, not limited by the wavelength of the associated wave since it is of angstrom order, unlike the above-described optical methods. Nevertheless, atomic micro-lithography used in interaction with optical masks requires masking potential at a high level of intensity, and thus requires the lightwave that creates the potential to be of high intensity, in order to obtain significant disturbance of the trajectories of the atoms. Thus, such an installation is not flexible in use. In addition, the resolution that is obtained is limited by the performance of the mask used.

OBJECTS AND SUMMARY OF THE INVENTION

The invention proposes a novel technique of implementing atomic lithography, while avoiding the above-mentioned drawbacks. This technique uses Stern-Gerlach type atomic interferometry under special conditions that make it possible to achieve atomic phase disturbances of the beam rather than trajectory disturbances. Such interaction modulates, both directly and in controllable manner, the intensity of the associated wave in the plane extending transversely to the beam of atoms.

More precisely, the invention provides a method of lithography by atomic interferometry on a target, on the basis: of spin polarizing a beam of incident atoms by optical pumping; of passing through a phase object by transverse magnetic induction acting on a coherent superposition of states; and then of analyzing the beam of atoms by optical interaction so as to retain only a single spin state, the emerging beam of atoms containing a series of interference terms; wherein the magnetic induction presents a transverse gradient to form an annular interference pattern, wherein the beam of atoms presents a speed distribution greater than 20% in order substantially to eliminate interference fringes other than the central fringe which then forms a spot, and wherein adjustable transverse uniform magnetic induction is added to the induction having a gradient so as to move the central spot in translation in predetermined manner over the target.

The use of a broad distribution of atom speeds, of the Maxwell type, causes contrast to drop off quickly with interference order, i.e. it reduces the contrast of the rings of the interference pattern outside the central spot.

In a particular implementation, the gradient of the transverse induction is adjusted as a function of the desired spot intensity and diameter. The resulting spot becomes finer and more intense with increasing gradient. It is the limit value of resolution in three dimensions of the apparatus used that finally determines the magnitude of the field gradient to be applied.

The invention also provides an installation for performing nanolithography by atomic interferometry implementing the above method.

In one embodiment, the installation comprises an installation for nanolithography by atomic interferometry, the installation comprising a Stern-Gerlach type interferometer with a phase object in the form of four-pole magnetic induction with a transverse gradient created by four parallel bars carrying alternating direct currents, bracketed between two separator zones, preceded and followed respectively by a spin polarizer and by an analyzer operating by laser pumping, the additional uniform field being created by four other bars of the same length as and placed at 45° to the preceding bars and carrying paired currents.

The internal energy of the atoms is quite sufficient for etching a film of polymer resin placed on a substrate, for example their internal energy can be greater than or equal to 15 electron volts (eV), and the beam intensity can be a few $10^9$ atoms per second.

According to preferred characteristics:
- the source of atoms is a source for continuously discharging metastable helium or argon with an approximately Maxwell type speed dispersion of about 30% to 40% around approximately 2 kilometers per second (km/s) for atoms of helium and 500 meters per second (m/s) for atoms of argon;
- the laser pumping of the polarizer is performed by a circularly polarized laser diode, the spin polarization being performed on Zeeman level +J or −J;
- the analysis is performed by deflecting atoms that lie in Zeeman states other than the selected state by using different light frequencies by means of at least one acousto-optical modulator coupled to the laser in the presence of a magnetic field that is intense; and the separator plates are made up of physically-implemented gratings with ultrafine slits, or of optical gratings formed by a standing wave produced by laser radiation reflected on a mirror, or else by means of a very low intensity magnetic field turning through 90° to induce transitions between the Zeeman states.

In a preferred embodiment, the beam of atoms is collimated by transverse cooling by means of a two-dimensional optical molasses made up of two successive identical molasses acting respectively on one or the other of the transverse components, using laser beams that are broadened in frequency, being red shifted by means of an acousto-optical modulator and circularly polarized, and each molasses is formed by a series of "zigzag" reflections of the laser beam on two facing plane mirrors. The transverse speeds are then highly limited, being of the order of 0.1 m/s or less.

A constant magnetic gradient is of use only in the vicinity of the axis of a beam of approximately the same size as the pattern to be etched, e.g. a few microns. In particular embodiments, the gradient of the transverse magnetic field may be created by two coils in an "anti-Helmholtz" configuration, or by a set of electromagnets placed in a multipolar or 2n-polar configuration. These means enable the transverse field configuration to be adapted to the desired phase portrait for achieving a predetermined interference pattern.

BRIEF DESCRIPTION OF THE DRAWINGS

Other characteristics and advantages of the invention appear from the following detailed description relating to embodiments given as non-limiting examples with reference to the accompanying figures in which.

MORE DETAILED DESCRIPTION

Figure 1:
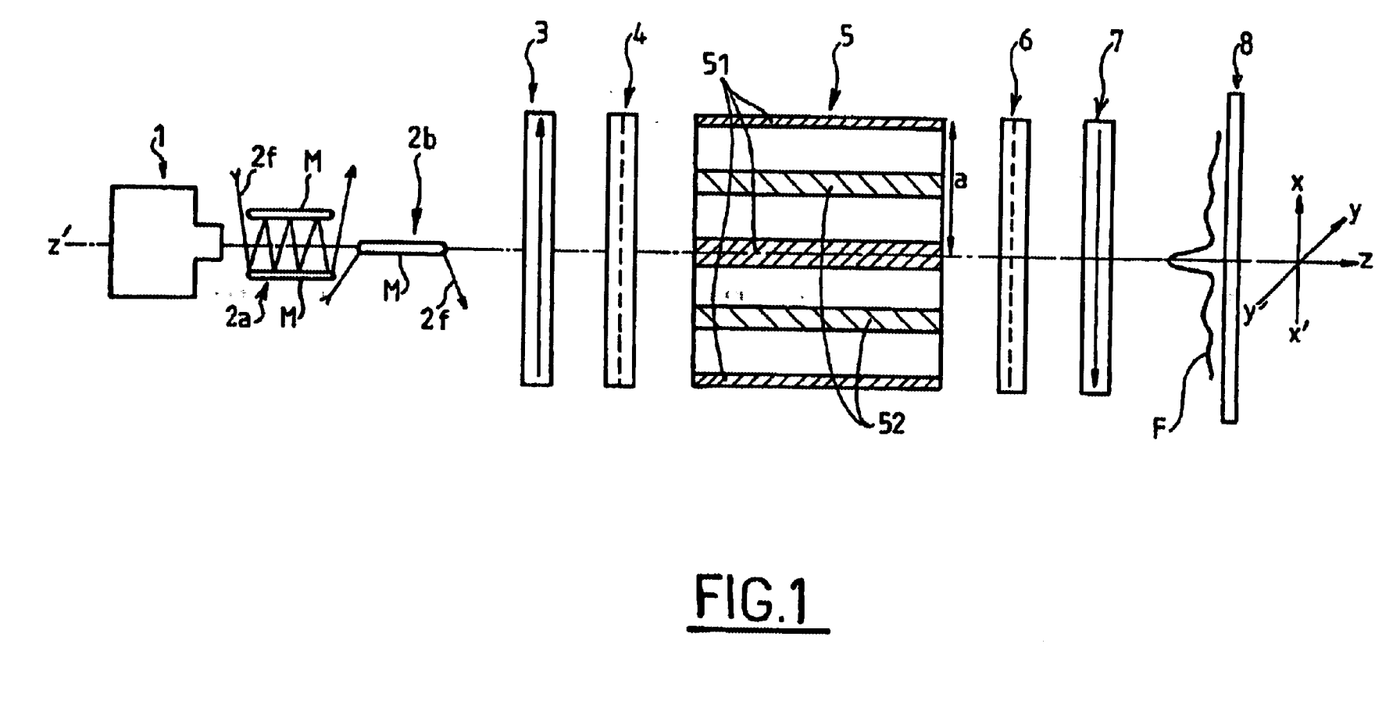
FIG. 1 is an overall diagram of a nanolithography installation of the invention.

The nanolithography installation shown in FIG. 1 is based on a Stern-Gerlach type interferometer. The component elements of such an interferometer comprise in succession, along a central axis Z'–Z, a polarizer 3, a set of bars 51 producing a transverse magnetic field forming the phase object between two separator plates 4 and 6, followed by analyzer 7 and then a detector 8 which is located at the position on the substrate where deposition or etching is to take place.

The atomic interferometer receives a beam of metastable helium atoms He* delivered by a source 1. The source has a continuous electrical discharge triggered in expansion through a nozzle between a conical tungsten electrode and the nozzle. The discharge takes place at a voltage of about 1 kiloelectron volts (keV) and at a current of several milliamps (mA). Advantageously, the discharge can be pulsed and the resulting gas can be cooled, e.g. using liquid nitrogen.

Figure 2:
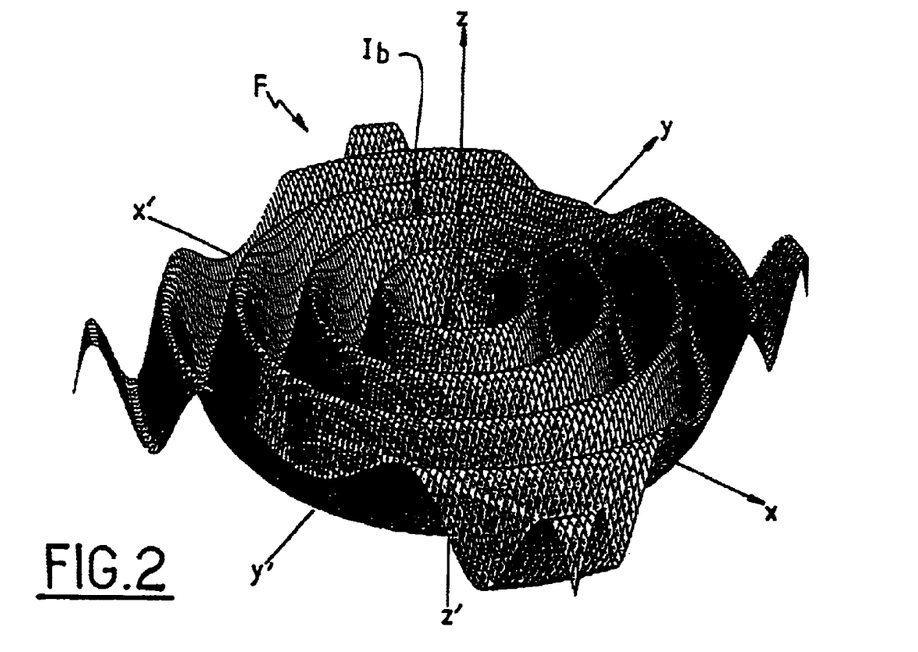
FIG. 2 is a simplified perspective view of an interference pattern obtained in the plane extending transversely to the beam of atoms when it is in the form of a monokinetic beam.
Figure 3:
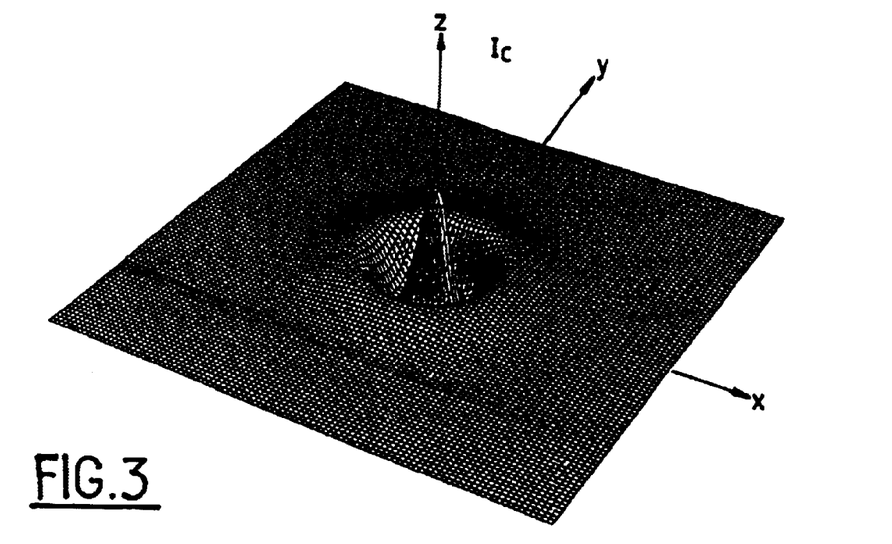
FIG. 3 is a similar perspective view when the beam of atoms has a Maxwell type speed distribution of 40%.

The density at which atoms are delivered is then greater than about $4 \times 10^{14}$ atoms per second per steradian (atom/s/srd) over an angular range of 0.5 radians (rd), and the speed distribution of the atoms is of the Maxwell type, and is broad, being about 30% about a mean value of 2 km/s. By superposing interference patterns having different pitches, such dispersion give rise to interference rings with contrast that falls off quickly. As shown in FIG. 2, in the absence of any dispersion in speed, the interference pattern F presents constant contrast between bright interference fringes $I_b$ and dark interference fringes $I_s$. However with speed dispersion of about 30%, associated with Maxwell type distribution, only the bright central fringe $I_c$ forming a fine central spot remains, as can be seen in FIG. 3, which spot stands out significantly from the other rings which are highly attenuated along the Z'–Z axis. FIGS. 2 and 3 are simulations which take account of all of the parameters that are quantified in the present description.

The angular aperture of the helium jet output by the source 1 is defined by the collimation performed by transverse cooling. This cooling is implemented by means of two optical molassess 2*a* and 2*b* acting on the transverse speed components of the atoms, respectively along the X'–X axis and along the Y'–Y axis. They use two laser beams 2*f* with red-shifted broadened frequency side bands of width 15 MHz to 20 MHz, the spectral offset and width being obtained using an acousto-optical modulator (not shown). These laser beams are circularly polarized. The beams 2*f* are subjected to a series of reflections between two facing plane mirrors M located to form a "zigzag" of width equal to 8 millimeters (mm), the interaction length then being raised to 8 centimeters (cm) for each molasses. The working laser power remains low, about 40 milliwatts (mW). Under such conditions, the beam of atoms presents an aperture of about 0.1 rd and transverse speeds of less than 0.1 m/s.

The optical interaction between the beam of helium atoms and the polarizer 3 selects a Zeeman sublevel relative to the quantization axis of the polarizer (with magnetic field) implemented by light pumping in one embodiment. This pumping is obtained by means of a laser beam polarized by a distributed Bragg reflector (DBR) diode having a wavelength of 1.08 micrometers ($\mu$m) and power of 1 mW. This laser beam is colinear with a magnetic field having intensity of about one Gauss.

The beam is thus subjected to spin polarization through the polarizer 3. The separator plate 4 transforms the Zeeman state selected by the polarizer, e.g. the +1 state or the –1 state into a coherent superposition of identical states for all of the atoms. The characteristics of the resulting interference pattern are a function of the phase object 5 which is constructed by the coherent superpositions of the Zeeman states obtained using the separator zone 4. zm In this example, this separation effect is implemented by means of a low intensity magnetic field, e.g. of 10 milligauss (mG) turning through 900 over a distance of about 8 mm in order to induce "Majorana" type transitions between the Zeeman states.

In this example, the phase object 5 is constituted by a profile of magnetic induction B formed by four parallel copper bars 51 that are about 10 cm long and that are regularly distributed around the axis Z'–Z at a distance a of about 16 mm in this example. The bars carry alternating direct currents $\pm i_A$ of a few hundreds of milliamps, the bars being parallel to the axis Z'–Z. The magnetic induction B presents a transverse gradient that is radial and constant in the vicinity of the axis Z'–Z, and the field is said to be a "four-pole" field. The interference pattern F that is obtained is then annular in the transverse plane (X'–X, Y'–Y).

The four-pole magnetic field B of transverse gradient formed by the four parallel bars 51 induces a phase object for each Zeeman state with a phase shift that is proportional to the integral of the magnetic field B along the path followed by the atom, and that is inversely proportional to the speed of the atom under consideration. The phase shift is produced on the external movement relating to each Zeeman state.

The installation makes it possible to obtain a gradient G of about $5 \times 10^{-4}$ $i_A$/mm, but greater values, e.g. those used for simulations, of the order of $10^{-2}$ $i_A$/mm can easily be obtained by using other devices, e.g. coils in an anti-Helmholtz configuration or electromagnets in a hexapolar configuration.

The diameter of the central spot becomes finer with increasing gradient G. The installation gives gradients that are relatively modest, but it enables a spot to be obtained of a size that is about 10 nanometers. The gradient G is kept constant in the vicinity of the axis Z'–Z which is of a size similar to that of the pattern to be etched, e.g. a few micrometers. Only the initial width of the profile of the beam of atoms leaving the source is large relative to the size of the pattern to be etched or to be deposited.

The second separator plate 6 is made and operates in the same manner as the first separator plate 4 to form coherent superpositions for each atomic state emerging from the phase object. Other techniques exist for forming such a separation, e.g. diffraction through physically-embodied gratings having ultrafine slits, e.g. at 20,000 lines per millimeter, or optical gratings formed by a standing wave produced by laser radiation reflected on a mirror or by the reversal effect obtained by absorbing a resonant photon.

The analyzer 7 retains only a single Zeeman state so that the emerging flux of atoms contains only a series of interference terms forming annular bright and dark fringes of intensity that is measured by the detector 8. In the embodiment described, the analyzer 7 is constituted using a laser beam of the same type as that which forms the polarizer 3. This detector is substituted by the silicon substrate coated in resin which is to be etched or on which the desired structure is to be deposited.

Analysis is performed optically by radiation pressure deflecting the atoms which are in Zeeman states other than the selected state, using different light frequencies that are adjusted by one or two acousto-optical modulators operating with the same laser as the polarizer, in the presence of a magnetic field of the order of 100 gauss (G).

Figure 4:
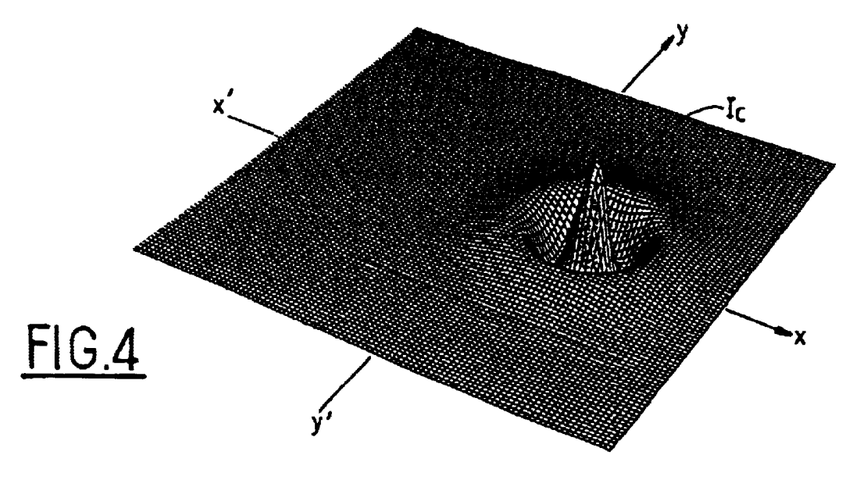
FIG. 4 is a perspective view of an example of how the interference pattern can be moved in translation by adding a uniform magnetic field.
Figure 5A:
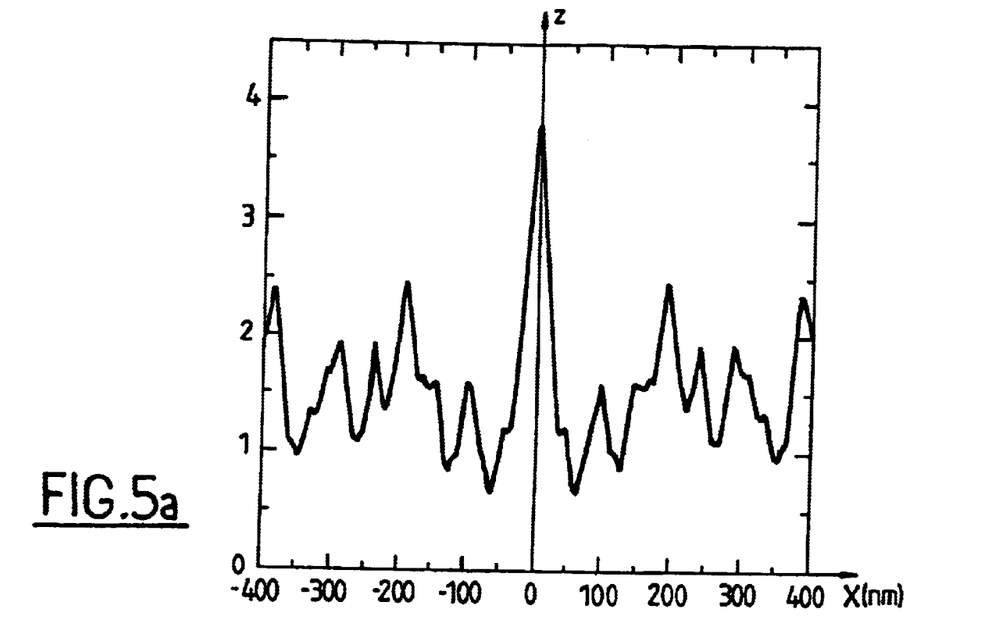
FIGS. 5*a* to 5*d* are interference profiles of an installation of the invention as obtained under various operating conditions.
Figure 5B:
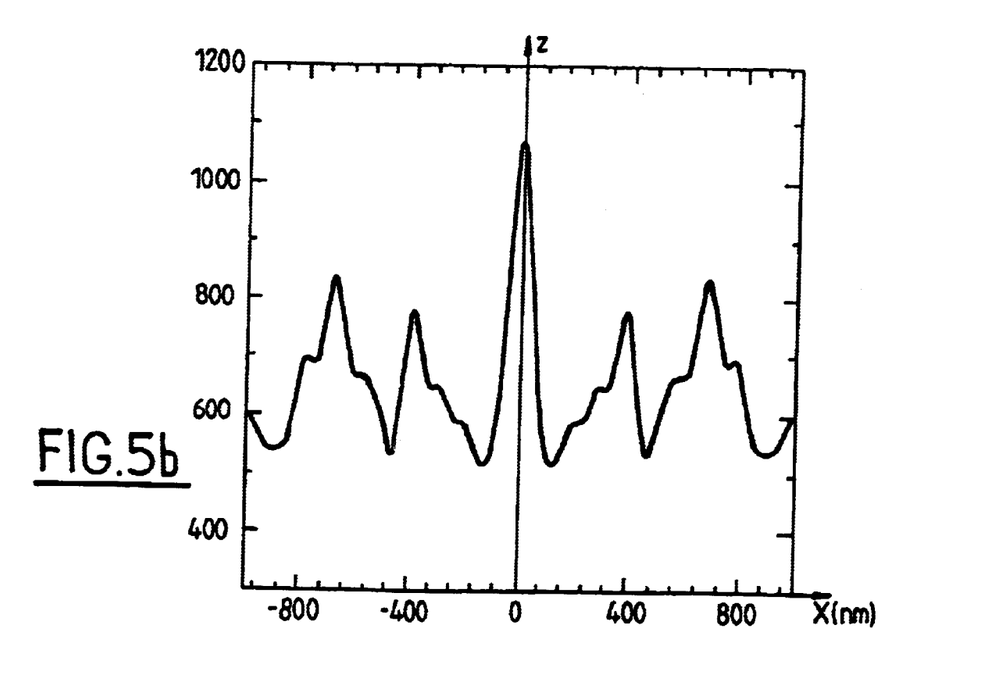
Figure 5C:
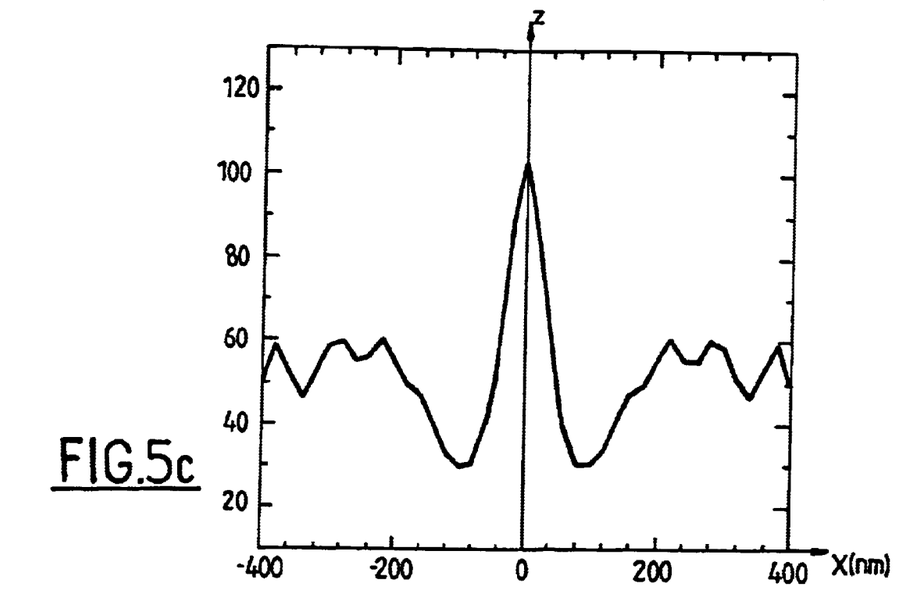
Figure 5D:
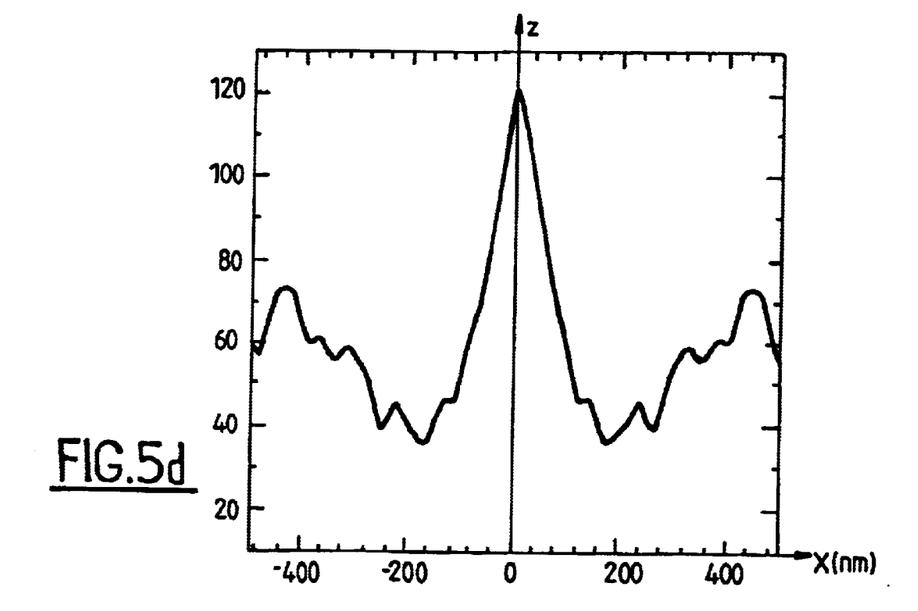

In order to enable patterns of predetermined shape to be etched or deposited on the substrate to be treated, an additional uniform magnetic field $B_h$ is produced by four bars 52 disposed at 45° to the first bars 51 in the transverse plane (X'–X, Y'–Y), the bars being fed with paired currents $\pm i_H$ of adjustable magnitude, e.g. about 0.1 A. Such an additional field then makes it possible to move the central spot in translation in the transverse plane of the substrate; the gradient is merely displaced along the axis X'–X about a new origin. FIG. 4 shows the central spot being shifted in translation along the axis X'–X.

In practice, it is possible to obtain any shift in translation in the transverse plane by feeding the bars 52 which are paired in turning order with adjustable currents $+i_1$, $+i_2$, $-i_1$, $-i_2$ so as to provide two parameters ($i_1$, $i_2$) and deliver a uniform field of arbitrary orientation and intensity.

It should be observed that if the gradient G of the main magnetic field B is increased by increasing $i_A$, then the intensities $i_H$, $i_1$, and/or $i_2$ must also be increased in order to shift the spot by the same amount, since the magnitude of the shift depends on the ratio $i_A/i_H$. For this purpose, the bars 52 delivering the additional fields can be replaced by two pairs of coils in a Helmholtz configuration.

Interference pattern profiles corresponding to varying implementations are shown in FIGS. 5a to 5d respectively, which figures were obtained by simulation.

The corresponding conditions are summarized in the table below, as a function of: source width (a); of relative width of the longitudinal speed distribution of the beam ($\delta v/v$); of the diameter of the resulting central spot ($\delta x$); and of the distances of the main components of the interferometer (d=distance between the source and the phase object, L=the width of the phase object, and D=the distance between the detector/substrate and the source).

TABLE

| FIG. | σ (μm) | δv/v | d (cm) | L (cm) | D (cm) | G/μm | δx (nm) | Sources |
|---|---|---|---|---|---|---|---|---|
| 5a | 0.2 | 1 | 5 | 5 | 11 | $4 \times 10^{-6}$ | 40 | coherent |
| 5b | 2000 | 2 | 5 | 20 | 200 | $4 \times 10^{-7}$ | 100 | coherent |
| 5c | 500 | 1 | 5 | 10 | 25 | $8 \times 10^{-7}$ | 80 | incoherent Zeeman state M = 0 |
| 5d | 2000 | 1 | 5 | 10 | 100 | $4 \times 10^{-7}$ | 120 | coherent Zeeman state M = 0 |

These examples show that spot diameters of one to a few tens of nanometers can easily be achieved under normal conditions. It should be observed that departures from the ideal shapes shown in FIGS. 5a to 5d give rise to deformation of the interference pattern but that this deformation is of no significance in any event.

It should be observed that the intensity of the emitted atomic current, i.e. the number of atoms per second and per square centimeter is equal to the intensity of the current on the resulting central spot, since the modulation implemented by the gradient acts only on the background intensity which is 2J+1 times smaller, where J is the spin of the atom used. For example, for argon (J=2), the background is five times smaller, and for a source emitting at $4 \times 10^{14}$ atoms/s/srd a current density of $1.3 \times 10^{10}$ atoms/s.cm$^2$ is obtained when the phase object distance D is equal to 0.5 m.

It should also be observed that in the etching or deposition mechanism, it is the internal energy of the metastable atoms used which performs the main function rather than the kinetic energy thereof, since the effect of speed is negligible.

For argon, the internal energy is about 15 eV per atom transferred to the resin, for helium the internal energy is greater than or equal to 20 eV. This energy is quite sufficient for etching a polymer film.

In the deposition process, the speed of the atoms is limited and the atom reflection factor becomes negligible. This applies to thermal speeds for "depositable" atoms of the alkali type or chromium.

In any event, it is the number of atoms reaching the target during a determined time interval which needs to be taken into consideration and not the speed of the atoms. By way of example, a threshold density can be about $10^{14}$ atoms/s/srd. In particular, the "depositable" atoms present a flux that is considerably greater (about $10^4$ times greater) than that of the metastable atoms, leading to a current density of about 1014 atoms/s.cm$^2$.

For etching, the metastable atoms do not dig directly into the resin covering the silicon medium, but they modify its properties by breaking its molecules with efficiency approaching unity. For example, several tens of atoms reaching an area having a diameter of 40 nm produce the desired effect which takes about 60 s. For deposition purposes, in order to deposit a thickness of 1 nm on the same area, it is necessary to deposit 10.5 d/$M_A$ where d is the density and $M_A$ is atomic mass, and this requires a duration of a few milliseconds.

Figure 6:
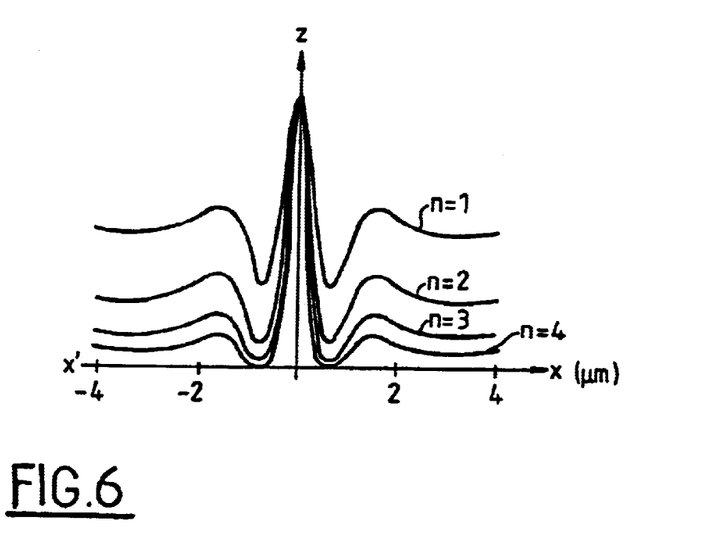
FIG. 6 shows examples of interference background around the central spot being reduced by using multiple interferometers.

The atomic spot appears on a background of uniform intensity which is equal to 1/(2J+1) of the intensity of the central spot. When the tracing speed is relatively low (about 0.7 nm/s), accumulated background intensity can become a drawback. This disturbance can be avoided by using a multiple interferometer, using a succession of interferometers placed in series, the analyzer of one interferometer being used as the polarizer of the next interferometer. FIG. 6 shows the final transverse profile as modulated by the successive interferometers when the number n of successive identical interferometers in series varies over the range 1 to 4. Contrast is thus very significantly improved since if M(ρ) designates the modulation induced by each interferometer, the final transverse profile is M(ρ)$^n$. The half-height diameter of the central spot is also reduced, by a statistical factor equal to $\sqrt{n}$.

The invention is not limited to the embodiments described and shown. The relationship describing the transverse distribution of density of atoms in the beam can be of the Gaussian type, for example, with a standard deviation of 100 μm.

What is claimed is:

1. A method of lithography by atomic interferometry on a target, on the basis: of spin polarizing a beam of incident atoms by optical pumping; of forming a phase object by transverse magnetic induction on the basis of a coherent superposition of spin states; and then of analyzing the beam of atoms by optical interaction so as to retain only a single spin state; the emerging beam of atoms containing a series of interference terms; wherein the magnetic induction presents a transverse gradient to form an annular interference pattern, wherein the beam of atoms presents a speed distribution greater than 20% in order substantially to eliminate interference fringes other than the central fringe which then forms a spot, and wherein adjustable transverse uniform magnetic induction is added to the induction having a gradient so as to move the central spot in translation in predetermined manner over the target.

2. A method of lithography according to claim 1, in which the gradient of the transverse induction is adjusted as a function of the desired spot intensity and diameter, the resulting spot becoming finer and more intense with increasing gradient.

3. An installation for nanolithography by atomic interferometry, the installation comprising a Stern-Gerlach type interferometer with a phase object in the form of four-pole magnetic induction with a transverse gradient created by four parallel bars carrying alternating direct currents, bracketed between two separator plates, preceded and followed respectively by a spin polarizer and by an analyzer operating by laser pumping, the additional uniform field being created by four other additional bars fed in paired manner with adjustable currents in order to create a uniform field of arbitrary orientation and intensity by adjusting two parameters.

4. An installation for nanolithography by atomic interferometry according to claim 3, in which the additional bars have the same length as the main bars, are disposed at 45° relative thereto, and carry paired currents.

5. An installation for nanolithography according to claim 3, in which the additional field bars comprise two pairs of coils in Helmholtz configuration.

6. An installation for nanolithography by atomic interferometry according to claim 3, in which the source of atoms is a source for continuously discharging metastable helium or argon with an approximately Maxwell type speed dispersion of about 30% to 40% around approximately 2 km/s for atoms of helium and 500 m/s for atoms of argon.

7. An installation for nanolithography by atomic interferometry according to claim 3, in which the laser pumping of the polarizer is performed by a circularly polarized laser diode, the spin polarization being performed on Zeeman level +1 or −1.

8. An installation for nanolithography by atomic interferometry according to claim 3, in which the analysis is performed by deflecting atoms that lie in Zeeman states other than the selected state by using different light frequencies by means of at least one acousto-optical modulator coupled to the laser in the presence of a magnetic field that is intense, e.g. of the order of 100 G.

9. An installation for nanolithography by atomic interferometry according to claim 3, in which the separator plates are made up of physically-implemented gratings with ultrafine slits, or of optical gratings formed by a standing wave produced by laser radiation reflected on a mirror, or else by means of a very low intensity magnetic field turning through 90° to induce transitions between the Zeeman states.

10. An installation for nanolithography by atomic interferometry according to claim 3, in which the beam of atoms is collimated by transverse cooling by means of a two-dimensional optical molasses made up of two successive identical molasses acting respectively on one or the other of the transverse components, using laser beams that are laterally enlarged in frequency, being shifted towards the red by means of an acousto-optical modulator and circularly polarized, and each molasses is formed by a series of "zigzag" reflections of the laser beam on two facing plane mirrors.

11. An installation for nanolithography by atomic interferometry according to claim 3, in which the gradient of the transverse magnetic field is created by two coils in an "anti-Helmholtz" configuration, or by a set of electromagnets placed in a multipolar or 2n-polar configuration.

12. An installation for nanolithography by atomic interferometry according to claim 3, in which the source makes use of a discontinuous electrical discharge struck in expansion through a nozzle between a conical electrode made of tungsten and the nozzle, thereby forming jets of atoms either of the alkali or chromium type, or else of the metastable hydrogen or inert gas type to obtain respectively deposition on a substrate that is to be treated or etching of a pattern in a resin placed on the substrate.

13. An installation for nanolithography by atomic interferometry according to claim 3, in which the interferometry is multiple in that use is made of a succession of interferometers in series, the analyzer of one interferometer being used as the polarizer of the next in order to eliminate the background from the interference pattern and in order to refine the central spot.

* * * * *